United States Patent
Chang et al.

(10) Patent No.: US 9,559,085 B2
(45) Date of Patent: Jan. 31, 2017

(54) METHOD FOR PRODUCING AN OPTOELECTRONIC DEVICE AND OPTOELECTRONIC DEVICE

(75) Inventors: Seng-Teong Chang, Penang (MY); Choon Keat Or, Penang (MY); Wai-Choo Chai, Penang (MY); Chong-Tee Ong, Penang (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/423,693

(22) PCT Filed: Sep. 11, 2012

(86) PCT No.: PCT/EP2012/067719
§ 371 (c)(1),
(2), (4) Date: Sep. 18, 2015

(87) PCT Pub. No.: WO2014/040614
PCT Pub. Date: Mar. 20, 2014

(65) Prior Publication Data
US 2016/0005720 A1    Jan. 7, 2016

(51) Int. Cl.
*H01L 21/00* (2006.01)
*H01L 25/13* (2006.01)
(Continued)

(52) U.S. Cl.
CPC ........... *H01L 25/13* (2013.01); *H01L 21/4803* (2013.01); *H01L 25/0753* (2013.01);
(Continued)

(58) Field of Classification Search
CPC .... H01L 25/13; H01L 33/486; H01L 21/4803; H01L 31/0203; H01L 33/54; H01L 33/62; H01L 31/02002; H01L 25/10; H01L 2933/0033; H01L 2933/005; H01L 2933/0066
(Continued)

(56) References Cited

U.S. PATENT DOCUMENTS 5,477,009 A * 12/1995 Brendecke .............. H01L 21/50
174/539
5,545,291 A * 8/1996 Smith ................... G02F 1/1362
257/E21.505
(Continued)

FOREIGN PATENT DOCUMENTS

CN       1147153 A    4/1997
CN     100382257 C    4/2008
(Continued)

OTHER PUBLICATIONS

Jackson, A.C., et al., "Transparent Self-Healing Polymers Based on Encapsulated Plasticizers in a Thermoplastic Matrix," Advanced Functional Materials, vol. 21, Issue 24, Dec. 20, 2011, pp. 4705-4711.
(Continued)

*Primary Examiner* — Thinh T Nguyen
(74) *Attorney, Agent, or Firm* — Slater Matsil, LLP

(57) ABSTRACT

A method for producing an optoelectronic device is specified. A housing base body is formed with a self-healing polymer material. A recess is found in the housing base body. The recess is confined by a bottom surface and at least one side wall which are formed at least in places by the plastic material of the base body. An optoelectronic semiconductor chip has a first main surface, a second main surface facing away from the first main surface and at least one side surface connecting the first main surface and the second main surface with each other. The optoelectronic semiconductor chip is placed in the recess, so that the first
(Continued)

main surface is brought in contact with the bottom surface and the at least one side surface is brought in contact with the at least one side wall.

8 Claims, 4 Drawing Sheets

(51) Int. Cl.
    H01L 25/075    (2006.01)
    H01L 33/54     (2010.01)
    H01L 33/56     (2010.01)
    H01L 21/48     (2006.01)
    H01L 25/10     (2006.01)
    H01L 31/02     (2006.01)
    H01L 31/0203   (2014.01)
    H01L 33/48     (2010.01)
    H01L 33/62     (2010.01)

(52) U.S. Cl.
    CPC .......... *H01L 25/0756* (2013.01); *H01L 25/10* (2013.01); *H01L 31/02002* (2013.01); *H01L 31/0203* (2013.01); *H01L 33/486* (2013.01); *H01L 33/54* (2013.01); *H01L 33/56* (2013.01); *H01L 33/62* (2013.01); *H01L 2924/0002* (2013.01); *H01L 2933/005* (2013.01); *H01L 2933/0033* (2013.01); *H01L 2933/0066* (2013.01)

(58) Field of Classification Search
    USPC .......... 257/88, 433, 99, 100, 704, 686, 777, 257/E23.17; 438/28, 22, 25.26, 23
    See application file for complete search history.

(56) References Cited

U.S. PATENT DOCUMENTS

| | | | |
|---|---|---|---|
| 5,824,186 A | 10/1998 | Smith et al. | |
| 6,274,508 B1* | 8/2001 | Jacobsen | G02F 1/133305 156/324 |
| 6,316,278 B1* | 11/2001 | Jacobsen | G02F 1/1345 257/E21.705 |
| 6,590,346 B1* | 7/2003 | Hadley | H01L 23/5389 257/E21.705 |
| 7,893,452 B2 | 2/2011 | Härle | |
| 8,158,983 B2* | 4/2012 | Beeson | H01L 25/0753 257/291 |
| 2001/0031514 A1 | 10/2001 | Smith | |
| 2003/0035994 A1* | 2/2003 | Zavilenski | A44C 15/0015 429/121 |
| 2004/0007784 A1* | 1/2004 | Skipor | B01J 13/02 257/788 |
| 2007/0029653 A1 | 2/2007 | Lehman, Jr. et al. | |
| 2009/0173951 A1 | 7/2009 | Kikkawa et al. | |
| 2011/0156234 A1 | 6/2011 | Hu | |
| 2012/0223045 A1* | 9/2012 | Burke, Jr. | A61J 7/0472 215/228 |
| 2013/0106868 A1* | 5/2013 | Shenoy | B81C 1/00269 345/501 |

FOREIGN PATENT DOCUMENTS

| | | |
|---|---|---|
| DE | 19901918 A1 | 7/1999 |
| EP | 0747948 A2 | 12/1996 |
| WO | 2004007608 A2 | 1/2004 |

OTHER PUBLICATIONS

Koike, Y., "Microoptics and Photonics Polymer," Japanese Journal of Applied Physics, vol. 47, No. 8, Aug. 22, 2008, pp. 6629-6634.

Piqué, A., et al., "Embedding electronic circuits by laser direct-write," Science Direct, Microelectronic Engineering, vol. 83, Jul. 10, 2006, pp. 2527-2533.

Takenobu, T., et al., "Ink-Jet Printing of Carbon Nanotube Thin-Film Transistors on Flexible Plastic Substrates," Applied Physics Express, vol. 2, Feb. 6, 2009, pp. 025005-1-025005-3.

* cited by examiner

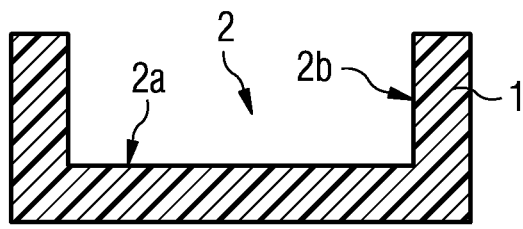
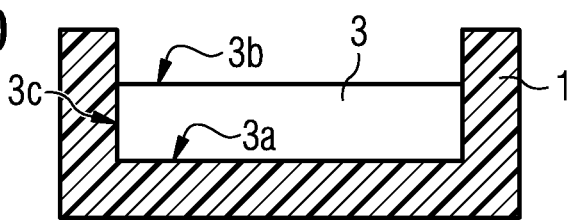
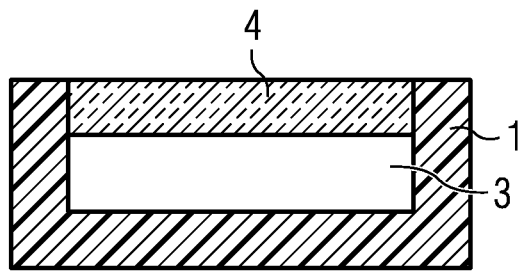
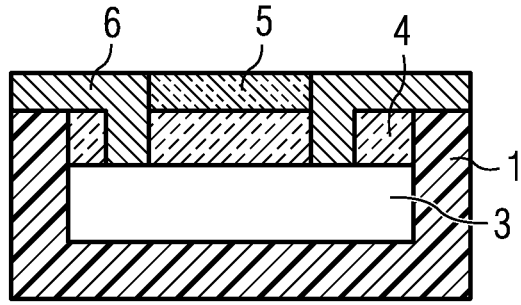
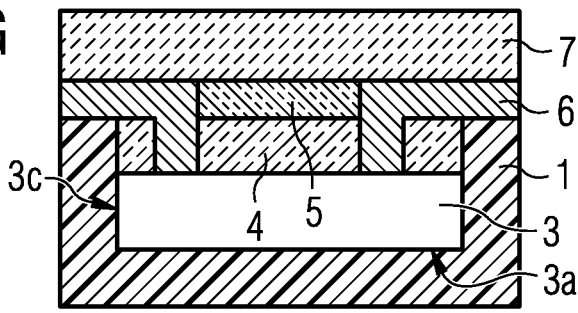

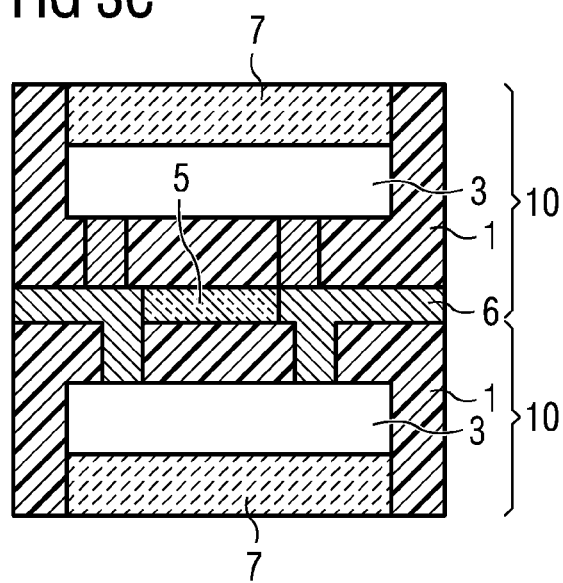
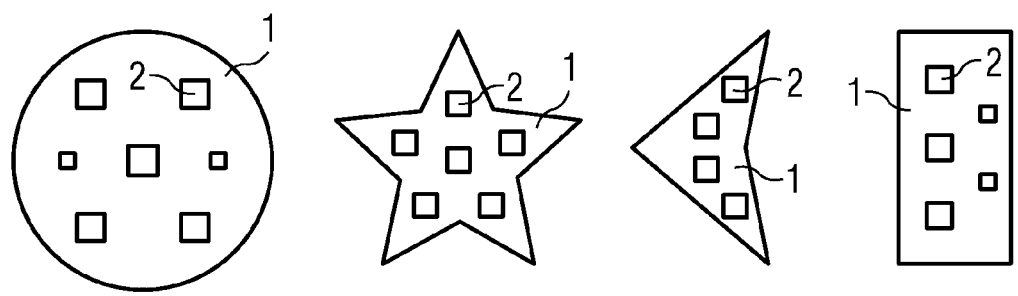

METHOD FOR PRODUCING AN OPTOELECTRONIC DEVICE AND OPTOELECTRONIC DEVICE

This patent application is a national phase filing under section 371 of PCT/EP2012/067719, filed Sep. 11, 2012, which is incorporated herein by reference in its entirety.

TECHNICAL FIELD

A method for producing an optoelectronic device is specified. Further, an optoelectronic device and an assembly of optoelectronic devices are specified.

BACKGROUND

U.S. Pat. No. 7,893,452 B2 describes an optoelectronic device.

SUMMARY

Embodiments of the invention specify an optoelectronic device that can be produced in a particularly cost-saving way and a method for producing such an optoelectronic device.

According to one aspect of method for producing the optoelectronic device, in one method step a housing body is provided. The housing body is formed with a plastic material. In particular, the housing body is formed with a plastic material which is transparent or translucent at least for a part of the radiation which is to be emitted or detected by the optoelectronic device. For example, the optoelectronic device is a light-emitting diode which produces electromagnetic radiation, e.g., light, during operation. Further it is possible that the optoelectronic device is a photodetector such as, for example, a photodiode or a photovoltaic cell.

According to one aspect of the method, in one method step a recess is formed in the housing base body. For example, the recess can be formed by molding the plastic material of the housing base body in such a way that the base body has a recess. Further, it is possible that the recess is formed as a cut-out in the material of the housing base body. In this case, the housing base body is a solid body formed with a plastic material from which a part of the plastic material is removed in order to form the recess. For example, the recess can be formed by laser engraving. Forming a recess after a solid body has been provided as the housing base body has the advantage that the dimensions of the recess can be chosen depending on the element, for example, a semiconductor chip, which is placed in the recess in a further method step.

For example, the recess is confined by a bottom surface and at least one side wall, for example, at least two side walls or in particular four side walls. The bottom surface and the at least one side wall are formed by the plastic material of the housing base body. This is to say that the recess is formed into the housing base body and at least parts of the bottom surface and the side walls confining the recess are formed by the material of the housing base body. For example, the bottom surface and the side walls are completely formed by the plastic material. Further, it is possible that, for example, at the bottom surface further elements, such as electrical contact elements, are arranged and form at least a part of the bottom surface.

According to one aspect of the method in a further method step an optoelectronic semiconductor chip is provided. For example, the optoelectronic semiconductor chip is a light-emitting chip such as, for example, a light-emitting diode chip, which produces visible light, IR or UV radiation during operation.

Further it is possible that the optoelectronic semiconductor chip is a detector chip, for example, a photodiode chip or a solar cell chip.

The optoelectronic semiconductor chip is formed with a semiconductor material. For example, layers of a group III-V compound semiconductor material are epitaxially grown on a growth substrate like sapphire or silicon in order to form the optoelectronic semiconductor chip.

According to one aspect of the method, the optoelectronic semiconductor chip has a first main surface, a second main surface facing away from the first main surface and at least one, for example, at least two, in particular four, side surfaces. The at least one side surface connects the first main surface and the second main surface with each other. For example, the optoelectronic semiconductor chip has the shape of a cuboid or a cube.

Electromagnetic radiation which is produced in the optoelectronic semiconductor chip or which is to be detected in the optoelectronic semiconductor chip passes through at least one of the two main surfaces. Further it is possible that part of the radiation passes through the at least one side surface of the optoelectronic semiconductor chip.

According to one aspect of the method, in a further method step the optoelectronic semiconductor chip is placed in the recess, wherein the first main surface is brought in contact with the bottom surface and the at least one side surface is brought in contact with the at least one side wall. Thereby it is possible that the surfaces of the semiconductor chip are brought in direct contact with the bottom surface and the at least one side wall of the housing base body.

Further it is also possible that every side surface of the semiconductor chip is brought in direct contact with a corresponding side wall of the base body in the recess. In this case, the dimensions of the recess are chosen in such a way that they exactly fit the dimensions of the semiconductor chip.

Further it is possible that there is some space between at least one side wall and the dedicated side surface of the semiconductor chip. In this case at least the first main surface is in direct contact with the bottom surface.

"In direct contact" means that there is no further material such as, for example, a glue or some other kind of fastener or bonding agent between the optoelectronic semiconductor chip and the material of the housing base body.

According to one aspect of the method, the plastic material of the housing base body comprises a self-healing polymer material. A self-healing polymer is a polymer material where cracks or fractures that occur, for example, during the production of the optoelectronic device, can be healed, for example, by heating the plastic material. For example, the heat can be generated by the optoelectronic semiconductor chip during operation of the device or externally. Further, the self-healing polymer allows for two or more parts formed with the self-healing polymer to be joined together upon heating without using a fastener or any other bonding agents between the components formed with the self-healing polymer.

Further, the self-healing plastic material can be a photonic polymer of zero absorption loss or a highly scattering optical transmission polymer.

Suitable self-healing or self-repairing polymers are, for example, described in the article "Transparent self-healing Polymers based on Encapsulated Plasticizers in a Thermoplastic Matrix" (Adv. Funct. Mater. 2011, 21, 4705-4711), which is incorporated by reference.

According to one aspect of the method, the method comprises the following steps:

providing an housing base body, wherein the housing base body is formed with a plastic material, forming a recess in the housing base body, wherein the recess is confined by a bottom surface and at least one side wall which are formed at least in places by the plastic material of the base body, providing a optoelectronic semiconductor chip, wherein the optoelectronic semiconductor chip has a first main surface, a second main surface facing away from the first main surface and at least one side surface connecting the first main surface and the second main surface with each other, placing the optoelectronic semiconductor chip in the recess, wherein the first main surface is brought in contact with the bottom surface and the at least one side surface is brought in contact with the at least one side wall, wherein the plastic material comprises a self-healing polymer material.

Thereby the order of the method steps can be changed. For example, the optoelectronic semiconductor chip can be provided before a housing base body is provided or the recess can be formed before the housing base body is provided. In this case the recess is, for example, provided by molding the plastic material of the housing base body.

Further, an optoelectronic device is specified. For example, the optoelectronic device can be produced by a here-described method. Accordingly all features of the method are disclosed for the optoelectronic device and vice versa. According to one aspect of the optoelectronic device the optoelectronic is characterized by at least one of the following features:

a housing base body having a recess, and an optoelectronic semiconductor chip, wherein the housing base body is formed with a plastic material, the plastic material comprises a self-healing polymer material, the recess is confined by a bottom surface and at least one side wall which are formed at least in places by the plastic material of the base body, the optoelectronic semiconductor chip has a first main surface, a second main surface facing away from the first main surface and at least one side surface connecting the first main surface and the second main surface with each other, and the optoelectronic semiconductor chip is arranged in the recess, wherein the first main surface is in contact with the bottom surface and the at least one side surface is in contact with the at least one side wall.

In the following aspects of the method and the optoelectronic device are specified.

According to one aspect an electrical insulating material is provided on the second main surface of the optoelectronic semiconductor chip. For example, the electrical insulating material at least partly fills the part of the recess which is not filled by the optoelectronic semiconductor chip. Thereby it is possible that a surface of the electrical insulating material facing away from the optoelectronic semiconductor chip terminates flush with the outer surface of the housing body which surrounds the recess in the material of the housing base body. For example, the electrical insulating material is a plastic material. The electrical insulating material can be formed with the same plastic material as the housing base body. Further it is possible that the electrical insulating material is given by a polyimide. The electrical insulating material can be provided by a molding technique or by sputtering.

According to one aspect at least one electrical contact is formed to the optoelectronic semiconductor chip on the second main surface of the optoelectronic semiconductor chip. The second main surface is the surface of the optoelectronic semiconductor chip which faces away from the bottom surface of the recess. For example, an n-contact and/or a p-contact are/is formed on the surface. Thereby it is possible that if two electrical contacts are formed on the second main surface the electrical contacts are separated from each other by the electrical insulating material and/or by a further electrical insulating material.

For example, the electrical contact is formed by a conductive ink or a conductive paste. The conductive ink or the conductive paste can be transmissive for the radiation detected or produced in the optoelectronic semiconductor chip. The optoelectronic contact can be employed using a printing method, for example, a laser printing method.

According to one aspect, at least one electrical contact to the optoelectronic semiconductor chip is formed on the first main surface of the optoelectronic semiconductor chip. In this case it is possible that the at least one optoelectronic contact is already present in the optical base body and contact to the chip is made by placing the optoelectronic semiconductor chip into the recess of the housing base body. For example, at least one electrical contact is formed on the bottom surface of the housing base body.

According to one aspect a cap is provided. The cap can be, for example, in the shape of a plate or in the shape of an optical lens. The cap is formed with a plastic material and comprises the self-healing polymer material of the plastic material of the housing base body. For example, the cap and the housing base body are formed by the same plastic material.

The cap is placed on a side of the housing base body which faces away from the first main surface of the optoelectronic semiconductor chip such that the cap spans over the recess in the housing base body. That is to say, the cap forms a lid for the recess and seals the semiconductor chip in the recess by spanning over the entire recess. For example, side surfaces of the cap terminate flush with side faces of the housing base body.

The cap and the housing base body are joined to each by heating. That is to say by using the self-healing properties the cap and the housing base body, i.e., the self-healing polymer of both components, are joined together upon heating. Consequently, the cap is integrally connected to the housing base body. There is no bonding agent or other fastener between the cap and the housing base body such that the connection and the housing base body is free from a fastener.

According to one aspect, the cap is formed by a further optoelectronic device which is, for example, identical to a here-described optoelectronic device. In this case two housing base bodies which are formed with the same plastic material are joined to each other by heating the plastic material and the connection between the two base bodies is due to the self-healing properties of the polymer forming the plastic material of the base bodies.

Further, an assembly of optoelectronic devices is specified. The assembly comprises at least two here-described optoelectronic devices. The two optoelectronic devices of the assembly can be identical optoelectronic devices. Thereby each of the two optoelectronic devices spans over the recess in the base body of the other optoelectronic device. That is to say, a first of the optoelectronic devices forms a cap for the recess of the second of the optoelectronic devices. The optoelectronic devices are integrally connected to each other at places where the base body of one of the optoelectronic devices is in contact, in particular in direct contact with the base body of the other optoelectronic device. The connection between the optoelectronic devices, i.e., between the base bodies of the optoelectronic devices, is free of a fastener or any other bonding agent. Due to the self-healing properties of the plastic material forming the optoelectronic base bodies, the connection between the two base bodies can be formed using heat which can be produced by operating the optoelectronic semiconductor chips in the recesses of the base bodies or by external heating.

A here-described optoelectronic device comprises an optoelectronic semiconductor chip which is free of casting material which is usually used for casting an optoelectronic chip in a recess of a housing base body. Consequently, the assembly of the optoelectronic devices becomes independent from the restriction of casting material use (e.g., phosphor loaded or without; silicon or epoxy) or molding processes (e.g., both encapsulating and molding).

The recess in the base body of the here-described optoelectronic component can be formed by laser direct write to create patterns of materials directly on the plastic material. Laser micromachining can be used to generate trenches or pockets for the optoelectronic chips to be inserted. In this way the recesses in the base body can be formed in a particularly easy way. By using laser micromachining technology, recesses of different sizes and location are possible on the same type of plastic material. This provides a fast switch from one package design to another without the need to change the complete assembly line for the production of the optoelectronic devices.

Laser printing of conductive ink or paste can be used to form the electrical contacts. The conductive ink or paste can be formed by a transparent material in order to allow for an especially high light output in the case of a radiation-emitting semiconductor device. Further, the use of conductive ink printing provides flexibility in the assembly of various devices.

Overall the here-described method allows for flexibility in changing design of the produced optoelectronic component. Further, base bodies of different shapes (e.g., squares, globes, stars) can be used. The produced optoelectronic devices are free from leadframes and all electrical routing in the devices can be changed with ease. The use of conductive ink or paste for forming the electrical contacts allows for a better CTE (coefficient of thermal expansion) match of the components of the device. All issues related to casting, e.g., the appearance of bubbles, smearing, insufficient casting and insufficient cooling, are eliminated by the here-described production method. The reversal of usual sequences and the application of polymer material replacing the commonly used silicon and/or resin or molds, frees the assembly from the trouble of tuning casting volume, curing profile, speed and timing.

BRIEF DESCRIPTION OF THE DRAWINGS

In the following the here-described method and the here-described optoelectronic device are explained in more detail in connection with the exemplary embodiments described below in association with the figures.

In the figures:

FIGS. 1A to 1G show an exemplary embodiment of a here-described method;

FIGS. 3A to 3C show an exemplary method for the production of a here-described optoelectronic device; and FIG. 4 shows exemplary embodiments for the housing base bodies of here-described optoelectronic devices.

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representation and/or for the sake of better understanding.

DETAILED DESCRIPTION OF ILLUSTRATIVE EMBODIMENTS

Figure 1A:
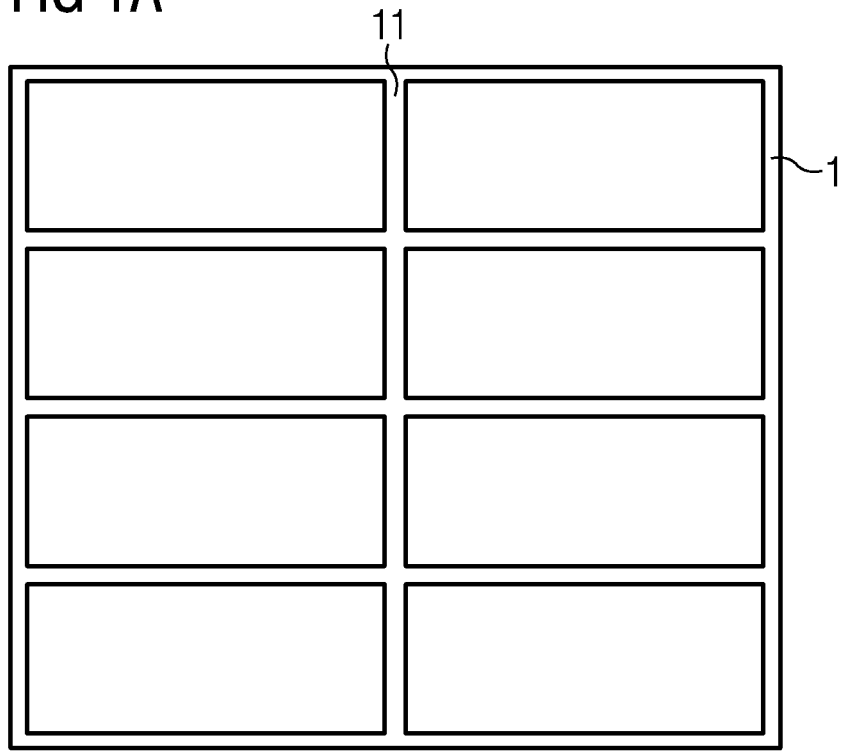

FIG. 1A shows a schematic plan view of a plurality of housing base bodies used in an exemplary embodiment of a here-described method. For example, housing base bodies are provided which are solid bodies in the form of cuboids. The housing base bodies are pre-cut and taped to a carrier 11. The housing base bodies 1 are formed with a plastic material which comprises a self-healing polymer which is, for example, given by a highly scattering optical transmission polymer.

Figure 1B:
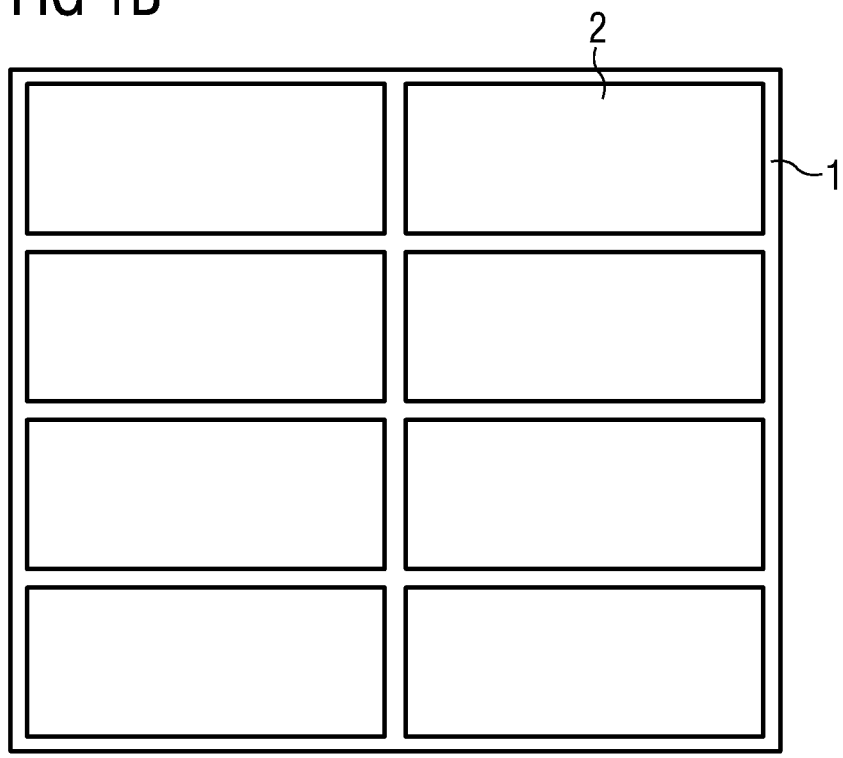

In a following method step, FIG. 1B, recesses 2 are formed in the material of the housing base body 1. For example, the recesses are formed by laser engraving. Each recess has the dimension and shape of an optoelectronic semiconductor chip which is to be placed in the recess.

FIG. 1C shows a side view of one of the base bodies 1 having the recess 2. The recess 2 is confined by bottom surface 2a and side walls 2b. Bottom surface 2a and side walls 2b are formed by the plastic material of the housing base body 1.

In the following method step, FIG. 1D, an optoelectronic semiconductor chip, for example, a light-emitting diode chip 3, is inserted into the recess 2. Thereby the first main surface 3a is brought in direct contact with the bottom surface 2a and the side surfaces 23 are brought in direct contact with the side walls 2b. The second main surface 3b is freely accessible through the opening of the recess 2

In a following method step, FIG. 1E, an electrical insulating material 4 is provided in the part of the recess 2 which is not filled by the optoelectronic semiconductor chip 3. For example, a polyimide is sputtered to form the electrical insulating material 4.

In the following method step, FIG. 1F, electrical contacts 6 are provided to the second main surface 3b of the semiconductor chip 3. For example, the electrical contacts are produced by printing using conductive ink. Thereby the contacts are, for example, provided in holes or wires which run through the electrical insulating material which are produced during or after production of the layer of electrical insulating material 4. A further electrical insulating material 5 which can be made of the same material as the electrical insulating material 4 and/or the housing base body 1 is formed between two oppositely poled electrical contacts 6. Further, it is possible that the further electrical insulating material 5 is a gas like, for example, air.

In the next method step, FIG. 1G, a cap 7 formed with the same self-healing polymer as the housing base body 1 is placed such that the cap 7 spans over the recess 2. The cap 7 and the housing base body 1 are jointed to each other by heating using the self-healing properties of the polymer material forming both parts in places where the cap 7 and the housing base body are in direct contact with each other (not seen from the side view of FIG. 1G).

In the resulting optoelectronic device shown in FIG. 1G, electromagnetic radiation passes, for example, through the first main surface 3a and the side surfaces 3c of the optoelectronic semiconductor chip 3. In the device only plastic materials having the same or a similar CTE are used such that the device is particularly stable under a thermal load.

Cracks or scratches in the surface of the base body or the cap which, for example, could arise during the mounting or the handling of the device, are healed using the self-healing properties of the polymer material by the heat generated by the optoelectronic semiconductor chip during operation of the device.

Figure 2:
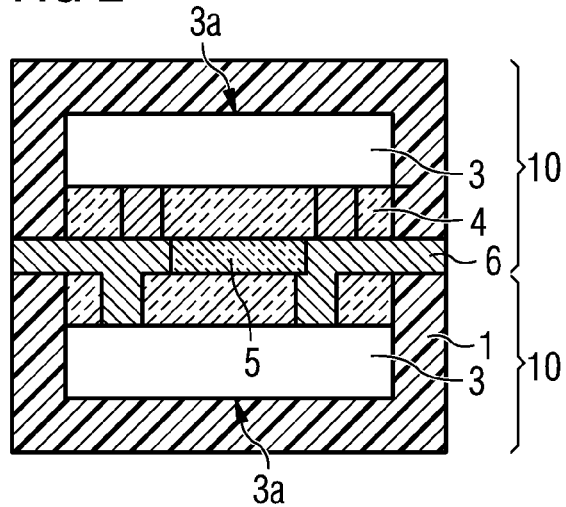
FIG. 2 shows an exemplary embodiment of a here-described optoelectronic component.

FIG. 2 shows a side view of the further example of a here-described optoelectronic device. In this example the cap 7 is replaced by a further, for example, identical, optoelectronic device 10. The optoelectronic devices are joined to each other using the self-healing properties of their housing base bodies 1. In such a way an optoelectronic device having a particularly long lifetime is specified.

Figure 3A:
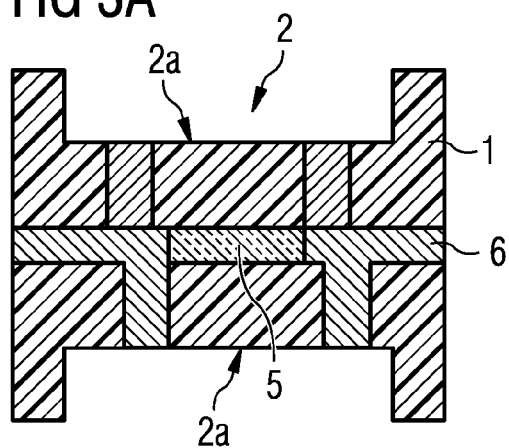
Figure 3B:
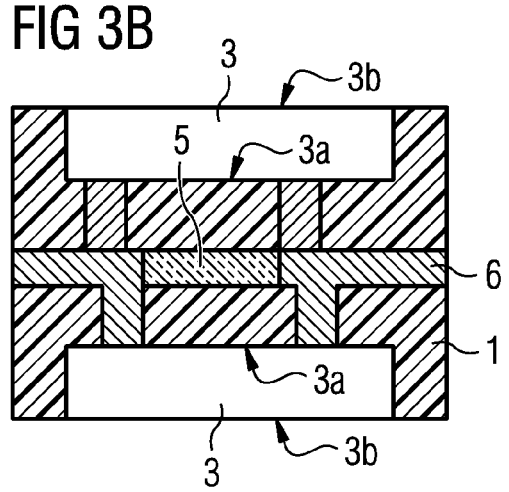

In connection with FIGS. 3A to 3C a further exemplary embodiment of a here-described method is specified. In this embodiment the electrical contacts 6 are provided on the bottom surface 2a of the recess 2. Further, the housing base body 1 comprises two recesses 2 which are formed on opposite sides of the housing base body 1.

Subsequently, FIG. 3D, in each recess 2 a semiconductor chip 3 is placed with its first main surface 3a facing the bottom surface 2a of the corresponding recess 2. Thereby it is possible that the second main surface 3b terminates flush with the outer surface of the base body 1 surrounding the corresponding recess.

In a next method step, FIG. 3C, caps 7 which comprise the same self-healing polymer material as the base body 1 are placed over the recesses 2 such they span over the entire recess and encapsulate the semiconductor chips 3 in the recesses. The caps 7 are joined to the base bodies 1 by heating and using the self-healing properties of the polymers used in the base body 1 and the cap 7.

In this way an assembly of two here-described optoelectronic devices 10 is produced.

In connection with FIG. 4 different base bodies 1 having recesses 2 are shown. The base bodies 1 can be used for the production of a here-described optoelectronic device. From this it becomes clear that housing base bodies of various shape and design can be used and that the recesses 2 in the housing base bodies can be of different shape and dimension. For example, one and the same housing base body can have two or more recesses of different size such that each of the recesses is employed to receive a semiconductor chip of different kind. For example, big, nitride-based blue-emitting semiconductor chips can be placed in big recesses and small arsenide-based red light-emitting semiconductor chips can be placed in small recesses.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. A method for producing an optoelectronic device, the method comprising:
   providing a housing base body, wherein the housing base body comprises a plastic material;
   forming a recess in the housing base body, wherein the recess is confined by a bottom surface and at least one side wall which are formed at least in places by the plastic material of the base body;
   providing an optoelectronic semiconductor chip, wherein the optoelectronic semiconductor chip has a first main surface, a second main surface facing away from the first main surface and at least one side surface connecting the first main surface and the second main surface with each other;
   placing the optoelectronic semiconductor chip in the recess, wherein the first main surface is brought in physical contact with the bottom surface and the at least one side surface is brought in physical contact with the at least one side wall;
   placing a cap comprising a self-healing polymer material on a side of the housing base body facing away from the first main surface of the optoelectronic semiconductor chip such that the cap spans over the recess in the base body; and
   joining the cap and the base body by heating.

2. The method according to claim 1, wherein the plastic material of the housing base body comprises a self-healing polymer material.

3. The method according to claim 1, wherein the cap comprises a further optoelectronic device.

4. The method according to claim 1, further comprising providing an electrical insulating material on the second main surface of the optoelectronic semiconductor chip.

5. The method according to claim 1, further comprising forming an electrical contact to the optoelectronic semiconductor chip on the second main surface of the optoelectronic semiconductor chip.

6. The method according to claim 1, further comprising forming an electrical contact to the optoelectronic semiconductor chip on the first main surface of the optoelectronic semiconductor chip.

7. The method according to claim 1, wherein after joining the cap and the housing base body by heating, the cap and the housing base body are in contact with each other.

8. The method according to claim 1, wherein after placing the optoelectronic semiconductor chip in the recess there is no material between the optoelectronic semiconductor chip and a material of the housing base body.

* * * * *